United States Patent
Shieh et al.

(10) Patent No.: US 8,907,336 B2
(45) Date of Patent: Dec. 9, 2014

(54) STABLE AMORPHOUS METAL OXIDE SEMICONDUCTOR

(71) Applicants: Chan-Long Shieh, Paradise Valley, AZ (US); Gang Yu, Santa Barbara, CA (US)

(72) Inventors: Chan-Long Shieh, Paradise Valley, AZ (US); Gang Yu, Santa Barbara, CA (US)

(73) Assignee: CBrite Inc., Goleta, CA (US)

( * ) Notice: Subject to any disclaimer, the term of this patent is extended or adjusted under 35 U.S.C. 154(b) by 0 days.

(21) Appl. No.: 13/758,293

(22) Filed: Feb. 4, 2013

(65) Prior Publication Data
US 2013/0143395 A1  Jun. 6, 2013

Related U.S. Application Data

(62) Division of application No. 12/206,615, filed on Sep. 8, 2008.

(51) Int. Cl.
*H01L 29/10* (2006.01)
*H01L 29/786* (2006.01)
*H01L 21/02* (2006.01)

(52) U.S. Cl.
CPC ...... *H01L 21/02592* (2013.01); *H01L 29/7869* (2013.01); *H01L 21/02565* (2013.01); *H01L 21/02554* (2013.01)
USPC .. 257/43; 438/681; 257/E21.28; 257/E33.064

(58) Field of Classification Search
CPC ................................. H01L 21/16; H01L 21/00
USPC ................ 257/43, E33.064, E21.28; 438/681
See application file for complete search history.

(56) References Cited

U.S. PATENT DOCUMENTS

2006/0110867 A1* 5/2006 Yabuta et al. .................. 438/151
2008/0299771 A1* 12/2008 Irving et al. ................... 438/681

\* cited by examiner

*Primary Examiner* — Dale E Page
(74) *Attorney, Agent, or Firm* — Parsons & Goltry; Robert A. Parsons; Michael W. Goltry

(57) ABSTRACT

A thin film semiconductor device has a semiconductor layer including a mixture of an amorphous semiconductor ionic metal oxide and an amorphous insulating covalent metal oxide. A pair of terminals is positioned in communication with the semiconductor layer and define a conductive channel, and a gate terminal is positioned in communication with the conductive channel and further positioned to control conduction of the channel. The invention further includes a method of depositing the mixture including using nitrogen during the deposition process to control the carrier concentration in the resulting semiconductor layer.

11 Claims, 2 Drawing Sheets

STABLE AMORPHOUS METAL OXIDE SEMICONDUCTOR

CROSS-REFERENCE TO RELATED APPLICATIONS

This application is a divisional application of currently pending U.S. application Ser. No. 12/206,615, filed 8 Sep. 2008.

FIELD OF THE INVENTION

This invention relates to metal oxide semiconductor material for use in channel layers of semiconductor devices.

BACKGROUND OF THE INVENTION

In the semiconductor industry and especially thin film semiconductor devices such as thin film transistors (TFTs), the devices include spaced apart source and drain areas that conduct through a channel layer positioned therebetween. At least one gate insulator and gate electrode are positioned above and/or below the channel layer, to control the conduction. In many applications TFTs are used where high heat cannot be tolerated during fabrication and, thus, a semiconductor must be used that can be deposited at relatively low temperatures (e.g. room temperature) but which still has relatively high mobility.

There is a strong interest in metal oxide semiconductor because of its high carrier mobility, light transparency and low deposition temperature. The high carrier mobility expands applications to higher performance domains that require higher frequency or higher current. The light transparency eliminates the need for a light shield in display and sensor active matrices. The low deposition temperature enables application to flexible electronics on plastic substrates.

The unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. In order to achieve high mobility for high performance applications, the volume carrier density of the metal oxide channel should be high and thickness of the metal oxide film should be small (e.g. <100 nm and preferably <50 nm).

However, a major deficiency of metal oxide semiconductors is stability and the tendency to become polycrystalline at higher process temperatures. Popular metal oxides, such as zinc oxide, indium zinc oxide, and indium gallium zinc oxide, are not very stable and become polycrystalline at moderate process temperatures (e.g. greater than approximately 400° C.) Polycrystalline semiconductor metal oxides are not desirable in semiconductor devices for several reasons. For example, the characteristics of transistors formed in polycrystalline semiconductor metal oxides can vary, even between adjacent devices in an array, because of the variation in crystal size and position. To better understand this problem, in a conduction area under a sub-micron gate each different transistor can include from one or two poly-silicon crystalline grains to several crystalline grains and the different number of crystals in the conduction area will produce different characteristics. The dimensions and their physical characteristics among different grains are also different.

The stability of metal oxide thin film transistors (TFTs) depends strongly on processing temperatures. At high temperatures, the traps in the bulk semiconductor layer and at the interface or interfaces between the gate insulator and the semiconductor layer can be reduced. For applications, such as active matrix organic light emitting devices (AMOLED), extreme stability is required. It is advantageous to take the metal oxide TFTs to high temperatures, generally between 250° C. and 700° C., during processing. Meanwhile it is desirable to maintain the amorphous nature of the metal oxide at these processing temperatures.

It would be highly advantageous, therefore, to remedy the foregoing and other deficiencies inherent in the prior art.

Accordingly, it is an object of the present invention to provide a new and improved metal oxide semiconductor material.

Another object of the invention is to provide a new and improved metal oxide semiconductor material with improved stability and has less tendency to become polycrystalline at higher processing temperatures.

Another object of the invention is to provide a new and improved metal oxide semiconductor material with improved stability, high carrier mobility, and good control of oxygen vacancies and carrier density.

SUMMARY OF THE INVENTION

Briefly, to achieve the desired objects of the instant invention in accordance with a preferred embodiment thereof, a stable amorphous metal oxide material is provided for use as a semiconductor in semiconductor devices, the material includes a mixture of an amorphous semiconductor ionic metal oxide and an amorphous insulating covalent metal oxide. The stable amorphous metal oxide material is represented by one of the formula $XO_aYO_b$, and X—O—Y, where YO is an amorphous insulating covalent metal oxide and XO is an amorphous semiconductor ionic metal oxide.

The desired objects of the instant invention are further achieved in a thin film semiconductor device having a semiconductor layer including a mixture of an amorphous semiconductor ionic metal oxide and an amorphous insulating covalent metal oxide. A pair of terminals is positioned in communication with the semiconductor layer and define a conductive channel, and a gate terminal is positioned in communication with the conductive channel and further positioned to control conduction of the channel.

The invention further includes a method of depositing the mixture including using nitrogen during the deposition process to control the carrier concentration in the resulting semiconductor layer.

BRIEF DESCRIPTION OF THE DRAWING

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
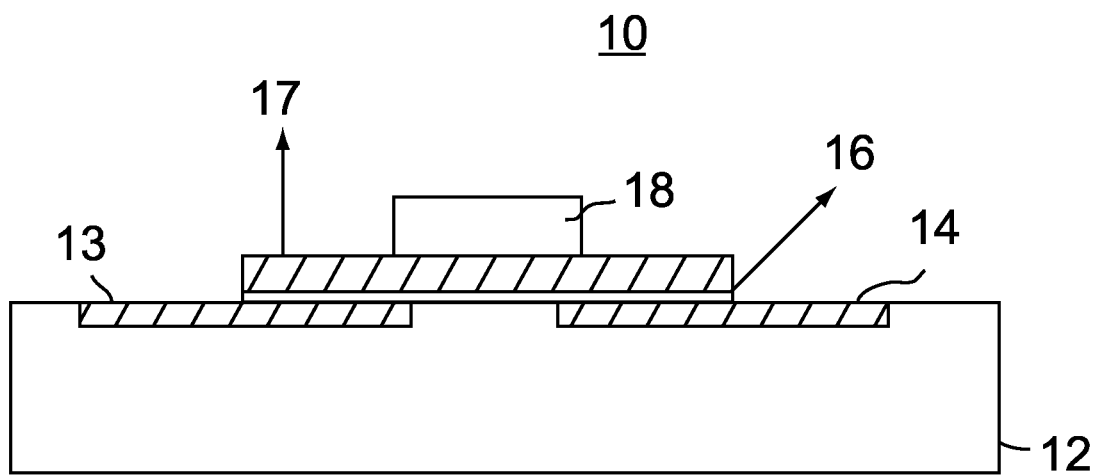
FIG. 1 is a simplified layer diagram of a TFT in accordance with the present invention with overlying gate and underlying source/drain.

Turning now to FIG. 1, a simplified layer diagram of one embodiment of a TFT 10, in accordance with the present invention, is illustrated. TFT 10 includes a substrate 12, which may be a flexible material, such as plastic, or any other convenient material, such as glass, etc. A source 13 and a drain 14 are formed in or on (hereinafter generically referred to as "on") the upper surface of substrate 12 in a spaced apart orientation using any well known method. A metal oxide film 16 is formed in partial overlying relationship to both source 13 and drain 14 and the space therebetween. It will be understood that metal oxide film 16 is the active layer that conducts carriers between the source/drain components. In a preferred embodiment, metal oxide layer 16 is less than 100 nm thick and preferably less than 50 nm. A thin gate dielectric layer 17 is formed in overlying relationship to metal oxide film 16 and a gate stack 18 is positioned on gate dielectric layer 17 in overlying relationship to the space between source 13 and drain 14. Thus, TFT 10 is a top gate, bottom source/drain type of device.

Figure 2:
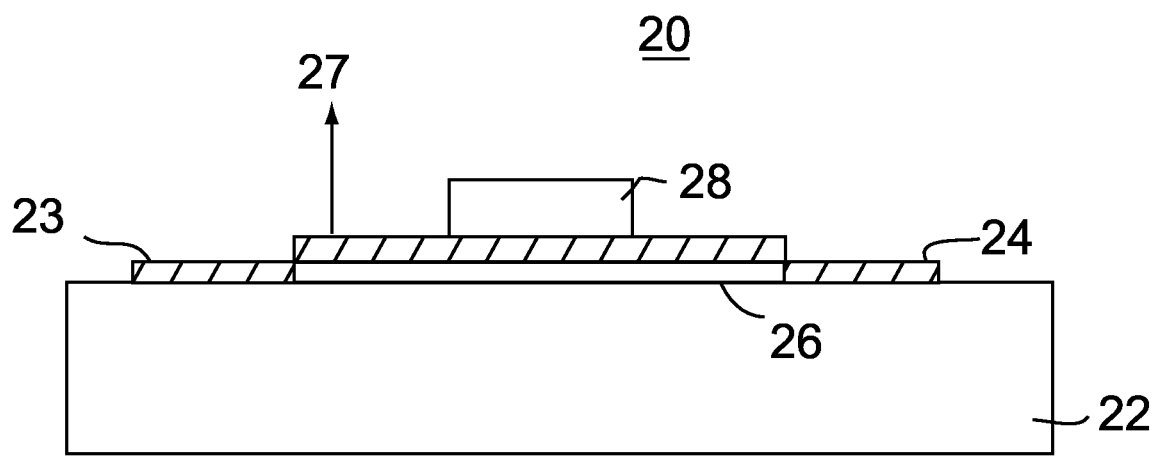
FIG. 2 is a simplified layer diagram of a TFT in accordance with the present invention with overlying gate and overlying source/drain.

Turning now to FIG. 2, a simplified layer diagram of another embodiment of a TFT 20, in accordance with the present invention, is illustrated. TFT 20 includes a substrate 22, which may be a flexible material, such as plastic, or any other convenient material, such as glass, etc. A metal oxide film 26 is deposited on substrate 22 and a source 23 and a drain 24 are formed partially in overlying relationship on the upper surface of metal oxide film 26 so as to form a spaced apart orientation on the upper surface. A thin gate dielectric layer 27 is formed in overlying relationship to metal oxide film 26 in the space between gate 23 and gate 24 and to portions of gate 23 and gate 24 adjacent to the space. A gate stack 28 is positioned on gate dielectric layer 27 in overlying relationship to the space between source 23 and drain 24. Thus, TFT 20 is a top gate, top source/drain type of device.

Figure 3:
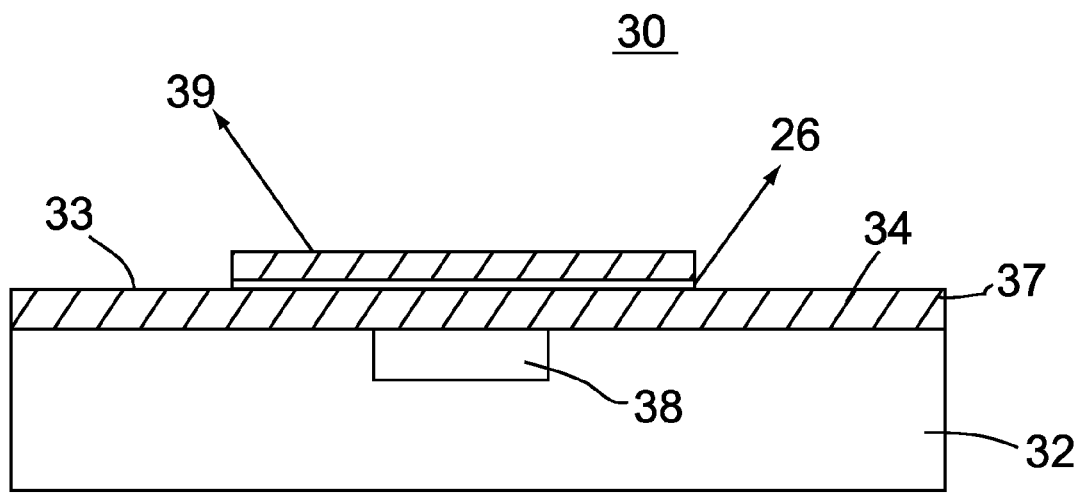
FIG. 3 is a simplified layer diagram of a TFT in accordance with the present invention with underlying gate and underlying source/drain.

Turning now to FIG. 3, a simplified layer diagram of another embodiment of a TFT 30, in accordance with the present invention, is illustrated. TFT 30 includes a substrate 32, which may be a flexible material, such as plastic, or any other convenient material, such as glass, etc. A gate stack 38 is formed in substrate 32 by any convenient and established method. A thin gate dielectric layer 37 is formed in overlying relationship to gate stack 38 and the surrounding areas of substrate 32. A source 33 and a drain 34 are formed in or on (hereinafter generically referred to as "on") the upper surface of gate dielectric layer 37 in a spaced apart orientation using any well known method. A metal oxide film 36 is formed in partial overlying relationship to both source 33 and drain 34 and the space therebetween. An optional passivation layer 39 is formed over metal oxide film 36. Thus, TFT 30 is a bottom gate, bottom source/drain type of device.

Figure 4:
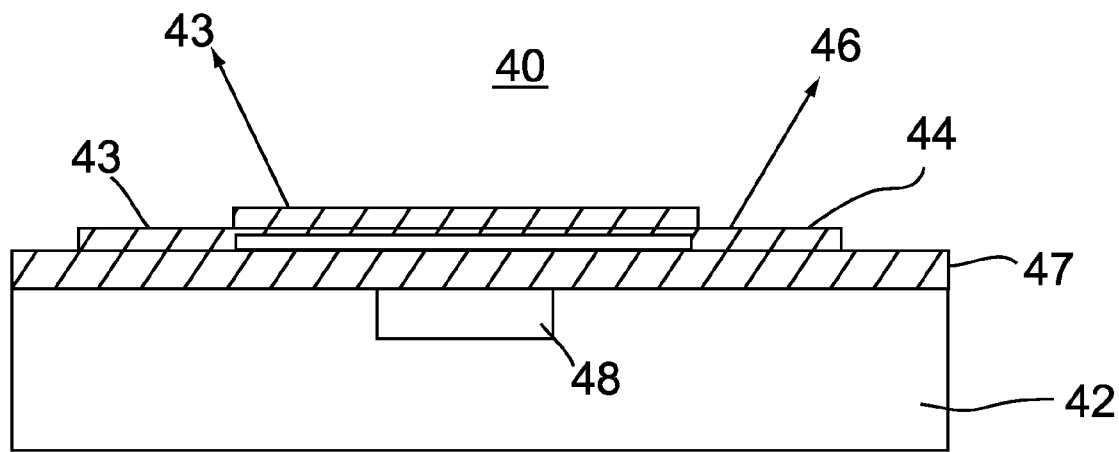
FIG. 4 is a simplified layer diagram of a TFT in accordance with the present invention with underlying gate and overlying source/drain.

Turning now to FIG. 4, a simplified layer diagram of another embodiment of a TFT 40, in accordance with the present invention, is illustrated. TFT 40 includes a substrate 42, which may be a flexible material, such as plastic, or any other convenient material, such as glass, etc. A gate stack 48 is formed in substrate 42 by any convenient and established method. A thin gate dielectric layer 47 is formed in overlying relationship to gate stack 48 and the surrounding areas of substrate 42. A metal oxide film 46 is formed on gate dielectric layer 47 in overlying relationship to gate stack 48 and the surrounding area. A source 43 and a drain 44 are formed partially in overlying relationship on the upper surface of metal oxide film 46 so as to define a space therebetween on the upper surface overlying gate stack 48. An optional passivation layer 49 is formed over the exposed portion of metal oxide film 46 and the surrounding portions of source 43 and drain 44. Thus, TFT 40 is a bottom gate, top source/drain type of device.

It will be understood that the above four examples of thin film transistors illustrate only some of the possible embodiments. For example, each of the above examples is a single gate transistor. Double gate transistors, i.e. a gate above and below the channel, are known in conjunction with virtually all of the examples. It is intended that the present invention applies to all possible or potential thin film transistors and other thin film devices, e.g. diodes, etc. Further, for purposes of this disclosure it will be understood that in all of the TFT examples the metal oxide film is defined as being "deposited on the substrate", even if a film is interposed therebetween.

Amorphous metal oxide semiconductor materials are desirable for use in the channel layer of semiconductor devices because of their high carrier mobility. For purposes of this disclosure, metal oxide semiconductor materials include at least one of zinc oxide, indium oxide, tin oxide, gallium oxide, cadmium oxide, or any combinations thereof. However, metal oxide semiconductors are relatively unstable and have a tendency to become polycrystalline at higher temperatures. Polycrystalline semiconductor metal oxides are not desirable in semiconductor devices because of the many drawbacks in their structure, including the relatively large grain size.

It is known in the art that the channel length of presently standard thin film transistors is less than approximately 5 microns. For purposes of this disclosure the term "amorphous" is defined as a material with grain size, along the channel length, much less than the channel length of presently standard thin film transistors, e.g. approximately 100 nanometers or less.

Some amorphous metal oxides, such as aluminum oxide, boron oxide, silicon oxide, magnesium oxide, beryllium oxide, and combinations thereof, are very stable and do not become polycrystalline easily. However, these metal oxides are not good semiconductors and cannot be used in semiconductor devices in their normal state.

It has been found that the stability of amorphous metal oxide semiconductor materials can be greatly improved by mixing some amorphous insulating metal oxides with amorphous metal oxide semiconductor materials. However, because the insulating amorphous metal oxides are virtually non-conducting, it is necessary to provide a continuous network of the amorphous metal oxide semiconductor materials through the resulting mixture. Thus, carrier flow is not interrupted by the amorphous metal oxide insulating materials mixed with the amorphous metal oxide semiconductor materials and mobility of the composite oxide can be high. Thus, the stability of the composite oxides is enhanced by the stable oxide component but the mobility remains high. Further, it will be understood that several different types of insulating amorphous metal oxides with different valences or other characteristics may be included in a composite mixture to achieve different results, at least one result being enhanced stability.

Some typical insulating amorphous metal oxides that can be used in a composite mixture include AlO, SiO, MgO, BeO, BO, and the like, and combinations thereof. Generally, the insulating amorphous metal oxides are more covalent in nature with a relatively high energy gap that is $E_g$ greater than approximately 6 eV. For ease of understanding, the insulating amorphous metal oxides may be referred to generically as 'covalent metal oxides'.

Generally, the amorphous metal oxide semiconductor materials are more, or practically, ionic in nature with a relatively low energy gap, that is $E_g$ less than approximately 4 eV. For ease of understanding, the semiconducting amorphous metal oxides may be referred to generically as 'ionic metal oxides'.

Different valence metals, i.e. metals from different groups in the periodic table, and mixtures thereof can be used to enhance stability or desirable semiconductor characteristics in a composite mixture. It will be understood that some covalent metal oxides will add more stability because they have a greater tendency not to crystallize (e.g. a higher energy gap). Also, the amount of stable or covalent metal oxide added to the composite mixture is determined by the necessity to maintain a continuous network of the amorphous metal oxide semiconductor materials.

In the present composite mixture, the amorphous metal oxide semiconductor materials are represented by XO and the insulating amorphous metal oxides are represented by YO. Thus, a formula for the composite mixture can be described as $XO_aYO_b$, where 'a' is the amount of amorphous metal oxide semiconductor material (ionic metal oxide) in the composite mixture and 'b' is the amount of insulating amorphous metal oxide material (covalent metal oxide) in the composite mixture. It should be understood that 'a' and 'b' are non-zero (greater than zero) and to comply with the requirement that the composite mixture include a continuous network of the amorphous metal oxide semiconductor materials, 'a' will generally be larger than 'b'. Preferably, b is larger than approximately 5% of the total material. Also, the amount of amorphous semiconductor ionic metal oxide is preferably greater than approximately 17% of the mixture.

The amorphous semiconductor ionic metal (X) and amorphous insulating covalent metal (Y) in the composite mixture, can in some instances form an atomic bond directly with oxygen, represented as X—O—Y herein. In such instances it should be understood that the formula X—O—Y simply replaces the formula $XO_aYO_b$. Further, it will be understood that in either instance a mixture of an amorphous semiconductor ionic metal oxide and an amorphous insulating covalent metal oxide is included in the stable amorphous metal oxide material.

One other problem that arises from mixing a stable metal oxide with an amorphous metal oxide semiconductor material is that the stable metal oxide tends to reduce the oxygen vacancies. If oxygen is used during deposition in the normal procedure (i.e. less than 5%), the oxygen vacancies can be substantially reduced and the conduction (mobility) of the composite material can become too low. For example, it has been found that by using oxygen during the deposition, carriers are decreased to less than $10^{18}$ carriers per $cm^3$. Thus, the use of oxygen to control the carrier concentration in the composite mixture, while it is possible, is very difficult and sensitive.

Instead of using oxygen to control the carrier concentration during deposition, it has been found that nitrogen ($N_2$) can used to reduce the carrier concentration. The presence of $N_2$ during deposition can reduce the carrier concentration, but not as strongly as oxygen because nitrogen is less reactive compared to oxygen. Thus, the use of nitrogen is less sensitive and it is easier to achieve the desired result.

Thus, a new and improved metal oxide semiconductor material has been disclosed that has improved stability and has less tendency to become polycrystalline at higher temperatures. Also, the new and improved metal oxide semiconductor material has high carrier mobility and good control of oxygen vacancies.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of forming a layer of stable amorphous metal oxide material for use as a semiconductor in semiconductor devices, the method comprising the steps of:
   providing an amorphous semiconductor ionic metal oxide material;
   providing an amorphous insulating covalent metal oxide material;
   mixing the amorphous insulating covalent metal oxide material with the amorphous semiconductor ionic metal oxide material in a predetermined ratio forming a continuous network of the amorphous semiconductor ionic metal oxide material;
   depositing the mixture of the amorphous semiconductor ionic metal oxide and the amorphous insulating covalent metal oxide on a substrate; and
   controlling carrier concentration of the mixture using one of oxygen and nitrogen during the deposition.

2. A method as claimed in claim 1 wherein the step of depositing the mixture of amorphous semiconductor ionic metal oxide and amorphous insulating covalent metal oxide includes depositing a mixture with a greater amount of the amorphous semiconductor ionic metal oxide than the amount of amorphous insulating covalent metal oxide.

3. A method as claimed in claim 2 wherein the step of depositing the mixture of amorphous semiconductor ionic metal oxide and amorphous insulating covalent metal oxide includes depositing a mixture with an amount of the amorphous semiconductor ionic metal oxide greater than approximately 17% of the mixture.

4. A method as claimed in claim 2 wherein the step of depositing the mixture of amorphous semiconductor ionic metal oxide and amorphous insulating covalent metal oxide includes depositing a mixture with an amount of amorphous insulating covalent metal oxide sufficient to prevent the amorphous semiconductor ionic metal oxide from becoming poly crystalline at high temperatures.

5. A method as claimed in claim 1 wherein the step of depositing the mixture of amorphous semiconductor ionic metal oxide and amorphous insulating covalent metal oxide includes depositing a mixture with an amount of amorphous insulating covalent metal oxide sufficient to prevent the amorphous semiconductor ionic metal oxide from becoming poly crystalline at temperatures in a range of approximately 250° C. to approximately 700° C.

6. A method as claimed in claim 1 wherein the step of depositing the mixture of amorphous semiconductor ionic metal oxide and amorphous insulating covalent metal oxide includes depositing a mixture with an amount of amorphous insulating covalent metal oxide sufficiently small to allow a continuous network of the amorphous semiconductor ionic metal oxide.

7. A method as claimed in claim 4 wherein the step of depositing the mixture of amorphous semiconductor ionic metal oxide and amorphous insulating covalent metal oxide includes depositing a mixture with an amount of amorphous insulating covalent metal oxide greater than approximately 5% of the mixture.

8. A method as claimed in claim 1 wherein the step of depositing the mixture of amorphous semiconductor ionic metal oxide and amorphous insulating covalent metal oxide includes depositing a mixture in which the amorphous semiconductor ionic metal oxide includes one of zinc oxide, indium oxide, tin oxide, and combinations thereof.

9. A method as claimed in claim 1 wherein the step of depositing the mixture of amorphous semiconductor ionic metal oxide and amorphous insulating covalent metal oxide includes depositing a mixture in which the amorphous insulating covalent metal oxide includes one of aluminum oxide, silicon oxide, magnesium oxide, beryllium oxide, boron oxide, and combinations thereof.

10. A method as claimed in claim 1 wherein the step of controlling carrier concentration of the mixture includes using nitrogen during the deposition.

11. A method of forming a layer of stable amorphous metal oxide material for use as a semiconductor in semiconductor devices, the method comprising the steps of:

providing a relatively unstable amorphous semiconductor ionic metal oxide including one of zinc oxide, indium oxide, tin oxide, and combinations thereof;

providing a stable amorphous insulating covalent metal oxide including one of aluminum oxide, silicon oxide, magnesium oxide, beryllium oxide, boron oxide, and combinations thereof;

mixing the amorphous insulating covalent metal oxide material with the amorphous semiconductor ionic metal oxide material in a predetermined ratio sufficient to allow a continuous network of the amorphous semiconductor ionic metal oxide and to prevent the amorphous semiconductor ionic metal oxide from becoming poly crystalline at temperatures in a range of approximately 250° C. to approximately 700° C.;

depositing the mixture of the amorphous semiconductor ionic metal oxide and the amorphous insulating covalent metal oxide on a substrate; and controlling carrier concentration of the mixture using one of oxygen and nitrogen during the deposition.

\* \* \* \* \*